United States Patent
Makimoto

(10) Patent No.: US 6,784,058 B2
(45) Date of Patent: Aug. 31, 2004

(54) PROCESS FOR MANUFACTURING SEMICONDUCTOR DEVICE INCLUDING LAMP ANNEALING

(75) Inventor: Hiromi Makimoto, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 66 days.

(21) Appl. No.: 10/122,316

(22) Filed: Apr. 16, 2002

(65) Prior Publication Data

US 2003/0008457 A1 Jan. 9, 2003

(30) Foreign Application Priority Data

Jul. 5, 2001 (JP) .................................. 2001-204249

(51) Int. Cl.$^7$ .............................................. H01L 21/336
(52) U.S. Cl. .................................... 438/264; 438/265
(58) Field of Search ....................... 438/257, 264–265, 438/585, 591; 257/314, 315, 316

(56) References Cited

U.S. PATENT DOCUMENTS 5,371,027 A * 12/1994 Walker et al. .............. 438/264

6,582,998 B2 * 6/2003 Nitta ........................... 438/217

FOREIGN PATENT DOCUMENTS

JP          58-121682     *   7/1983  ........... H01L/29/78

* cited by examiner

Primary Examiner—Evan Pert
(74) Attorney, Agent, or Firm—McDermott Will & Emery LLP

(57) ABSTRACT

A process for a semiconductor device includes the following steps applied to a silicon substrate wherein a floating gate electrode having sidewalls is formed above the semiconductor substrate with a tunnel oxide film intervened and wherein active regions are arranged in places adjoining both sides of floating gate electrode, as seen from above, and arsenic is injected into said active regions as an impurity:

the lamp annealing step of carrying out a heat treatment in the atmosphere of a first gas mixture which includes nitrogen and oxygen; and the oxygen film formation step of carrying out a heat treatment in the atmosphere of a second gas mixture which includes oxygen so as to form an oxide film on sidewalls of floating gate electrode after the lamp annealing step.

3 Claims, 5 Drawing Sheets

PROCESS FOR MANUFACTURING SEMICONDUCTOR DEVICE INCLUDING LAMP ANNEALING

BACKGROUND OF THE INVENTION

1. Field of the Invention

The present invention relates to a semiconductor device and to a process for the same. The invention particularly relates to a nonvolatile memory cell, or the like, as the semiconductor device.

2. Description of the Background Art

Referring to FIGS. 6 to 8, a process for a semiconductor device according to a prior art is described. As shown in FIG. 6, floating gate electrodes 4 are formed on the main surface of a silicon substrate 1 as a semiconductor substrate with tunnel oxide films 2 intervened. Control gate electrodes 5 are formed above floating gate electrodes 4 with ONO interlayer films 3 intervened. In the case of the example shown in FIG. 6, portions of top surfaces of control gate electrodes 5 are covered with TEOS (tetra-ethyl-orthosilicate) films 8. A source layer 7 and drain layers 6 are formed in the portions adjoining floating gate electrode 4, and the like, within the regions (hereinafter referred to as "active regions") wherein the main surface of silicon substrate 1 is exposed by injecting an impurity from above. In the example shown in FIG. 6, the electrodes and drain layer 6 are symmetrically arranged in a form wherein the right and the left memory cells share one source layer 7 in the center of the symmetrical structure in order to reduce the space.

In the case that an impurity, such as arsenic, is injected into the active regions, silicon substrate 1 is locally converted to an amorphous condition due to the effects of the injection. Next, as shown in FIG. 7, the entirety of the top surface of this substrate is covered with a TEOS film 9 by means of a CVD (chemical vapor deposition) method, or the like. After this, as shown in FIG. 8, the sidewalls of floating gate electrodes 4 are thermally oxidized by carrying out a heat treatment and oxide films 10 are formed so as to cover the sidewalls of floating gate electrodes 4. Here, the reason why oxide films 10 are formed is in order to prevent electrons, from the sidewalls of floating gate electrodes 4, from becoming volatile and in order to repair the etching damage. However, in the portions wherein source layer 7 or silicon substrate 1 in the vicinity thereof are converted to an amorphous condition, recrystallization of silicon occurs due to the heat in the heat treatment for forming oxide films 10. This recrystallization causes crystal defects 11 within silicon substrate 1. There is a risk that such crystal defects 11 may cause a current leak between source layer 7 and drain layer 6 so as to prevent a normal operation of the semiconductor device. In addition, merely the presence of crystal defects 11, which may cause the above described malfunction, reduces the reliability of the semiconductor device.

On the other hand, it is known that crystal defects do not easily occur at the time of recrystallization in the case that nitrogen is included in the silicon substrate. Therefore, in order to prevent the occurrence of crystal defects, a method of carrying out lamp annealing in a nitrogen flow can be considered at the stage of FIG. 6. This lamp annealing is also referred to as "RTP (rapid thermal process) treatment." In the case that lamp annealing is carried out in a nitrogen flow as shown in FIG. 9, though the inclusion of nitrogen in silicon substrate 1, which is the purpose, can be achieved, at the same time, nitride films 13 are formed on the sidewalls of the exposed floating gate electrodes 4. In the case that nitride films 13 are once formed in such a manner, the formation of oxide films 10 on the sidewalls of floating gate electrodes 4 cannot be achieved due to blockage by nitride films 13 even when a heat treatment is carried out in a later step, after coverage with TEOS film 9, as shown in FIG. 10. When oxide films 10 are not formed, there is a risk that electrons from the sidewalls of floating gate electrodes 4 may become volatized.

Therefore, purposes of the present invention are to provide a semiconductor device of a high reliability wherein electrons from the sidewalls of the floating gate electrodes are prevented from becoming volatized, while crystal defects are prevented from occurring in the semiconductor substrate so that no current leakage is caused as well as to provide a process for the same.

SUMMARY OF THE INVENTION

In order to achieve the above described purposes, a semiconductor device according to the present invention comprises a semiconductor substrate, a floating gate electrode formed above the semiconductor substrate with an oxide film intervened and active regions wherein the surface of the semiconductor substrate is exposed in the positions adjoining both sides of the floating gate electrode, as seen from above, wherein the semiconductor substrate includes impurity injection regions into which an impurity is injected towards the inside of the semiconductor substrate from the active regions, wherein the impurity injection regions include nitrogen over the entirety of the regions and wherein the floating gate electrode includes sidewalls and oxide films formed so as to cover the sidewalls in order to prevent electrons via the sidewalls from becoming volatized. By adopting this structure, a semiconductor device can be gained wherein the occurrence of crystal defects can be prevented at the time of a heat treatment while electrons from the floating gate electrode can be prevented from becoming volatized.

In the above described invention, the above impurity is preferably arsenic. By adopting this structure, arsenic can be easily made to enter the silicon substrate through injection because of its large atomic mass.

In order to achieve the above described purposes, a process for a semiconductor device according to the present invention includes the following steps applied to a semiconductor substrate wherein a floating gate electrode have sidewalls is formed above the semiconductor substrate with an oxide film intervened and wherein the substrate has active regions wherein the surface of the semiconductor substrate is exposed in the positions adjoining both sides of the floating gate electrode, as seen from above, and an impurity is injected into the active regions: the lamp annealing step of carrying out a heat treatment in the atmosphere of a first gas mixture which includes nitrogen and oxygen and the oxide film formation step of carrying out a heat treatment in the atmosphere of a second gas mixture which includes oxygen so as to form an oxide film on the sidewalls after the lamp annealing step. By adopting this process, the active regions can be made to include nitrogen without the formation of a nitride film on the sidewalls of the floating gate electrode in the lamp annealing step. Since a nitride film is not formed on the sidewalls of the floating gate electrode, an oxide film can be formed in a normal manner on the sidewalls of the floating gate electrode in the oxide film formation step.

In the above described invention, a gas mixture which includes no less than 10% and no more than 70% of a volume ratio of oxygen is used as the above first gas mixture.

By adopting this process, a nitride film is not formed on the sidewalls of the floating gate electrode and, in addition, the active regions are made to include a sufficient amount of nitrogen.

In the above described invention, the above impurity is preferably arsenic. By adopting this process, arsenic is easily made to enter the silicon substrate through injection because of its large atomic mass.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

Figure 6:
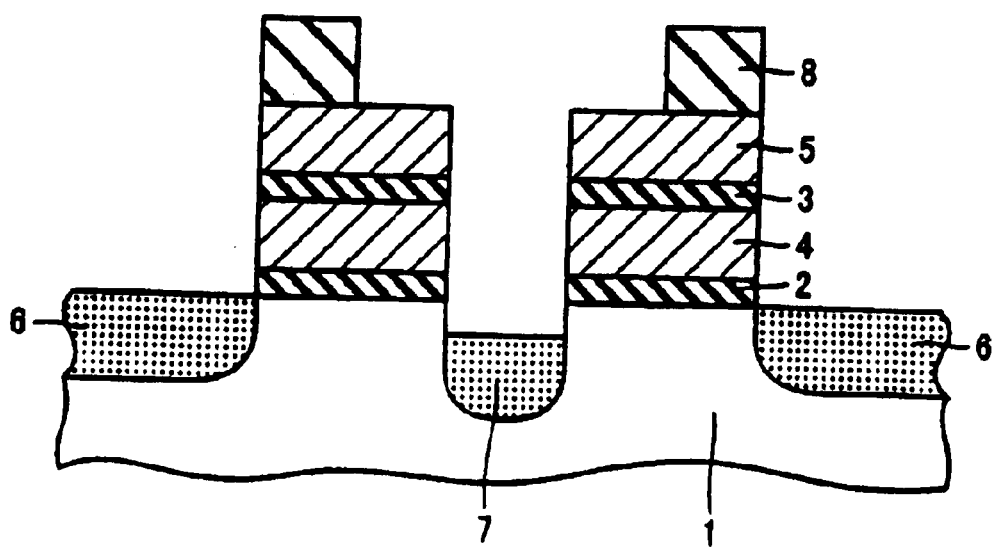
FIG. 6 is an explanatory view of the condition after an impurity injection in a process for a semiconductor device according to a prior art.
Figure 7:
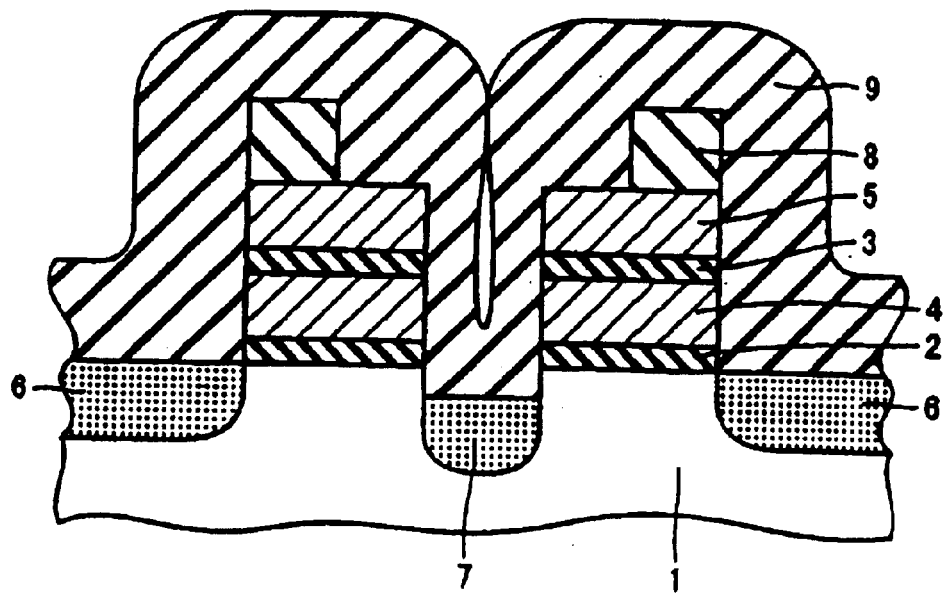
FIG. 7 is an explanatory view of the condition after a TEOS film formation in the process for a semiconductor device according to the prior art.
Figure 8:
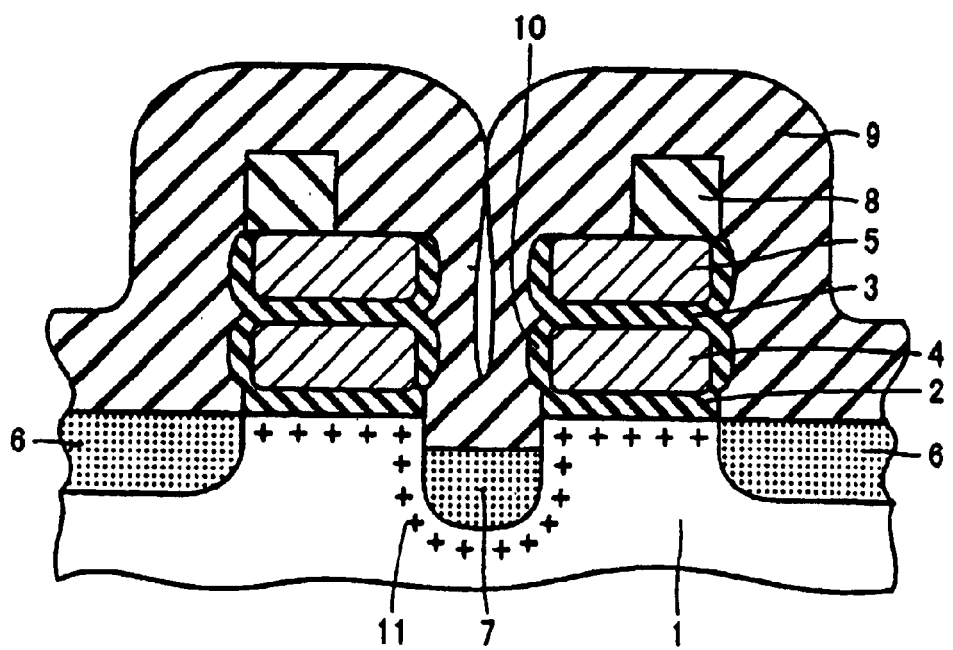
FIG. 8 is an explanatory view of the condition after a heat treatment in the process for a semiconductor device according to the prior art.

A process for a semiconductor device according to Embodiment 1 of the present invention is described. Process steps up to the structure as shown in FIG. 6 are the same as in the prior art. Here, instead of carrying out a lamp annealing in a nitrogen flow as is conventionally done, lamp annealing in a flow of a first gas mixture which includes oxygen and nitrogen is carried out. The oxygen content in the first gas mixture may be a volume ratio of no less than 10% and no more than 70%.

Figure 1:
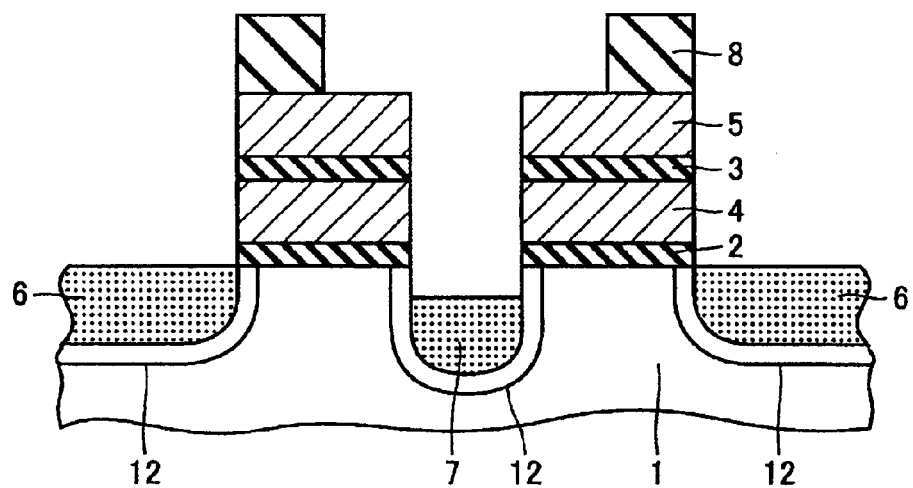
FIG. 1 is an explanatory view of the first step of a process for a semiconductor device according to Embodiment 1 of the present invention.
Figure 2:
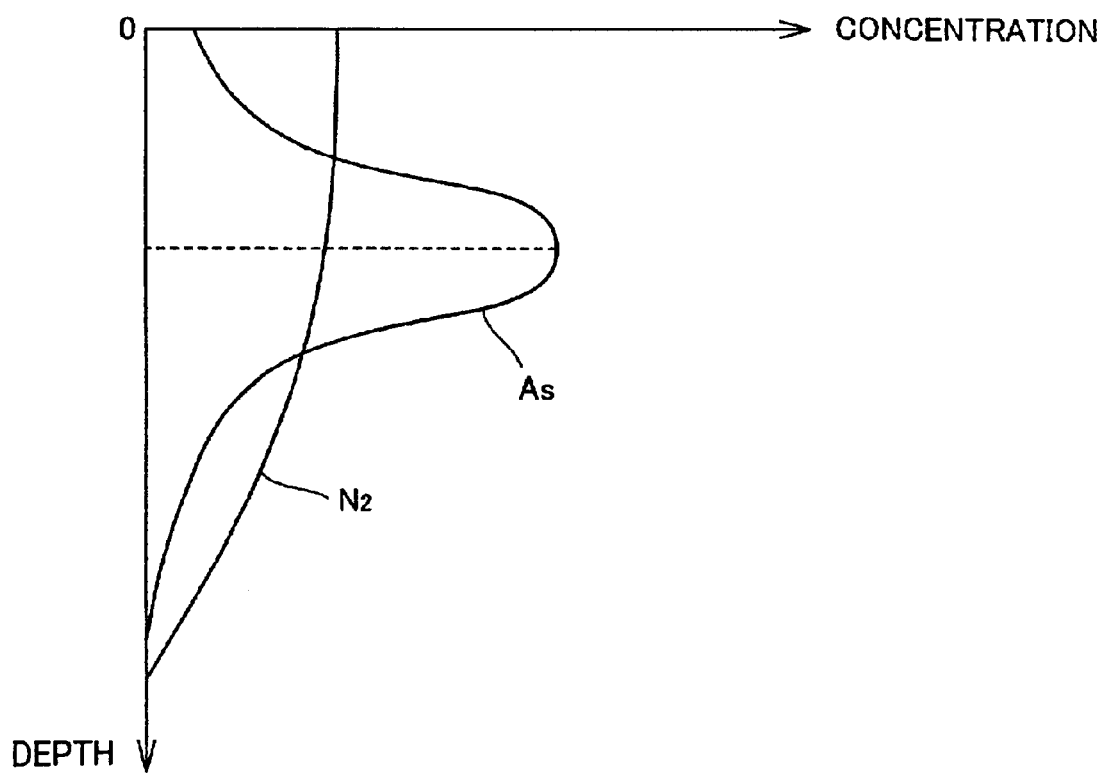
FIG. 2 is a graph showing the relationship between the depth from the substrate surface and the concentrations of nitrogen and arsenic according to Embodiment 1 of the present invention.

When the above described lamp annealing is carried out, as shown in FIG. 1, nitrogen enters into the active regions so that nitride regions 12 are formed so as to diffuse from the surface to the inside of the substrate. It is necessary to carry out the lamp annealing under the condition wherein nitride regions 12 are spread so as to completely include source layer 7 and drain layers 6. As a result, when the concentration distributions in the depth direction of arsenic As, which is the impurity in source layer 7, and of nitrogen atoms N, in a portion that has reacted with nitrogen through lamp annealing, are represented in a graph, it becomes the same as shown in FIG. 2. As is clear from FIG. 2, nitrogen is always included in a place where arsenic is included in silicon substrate 1.

Figure 3:
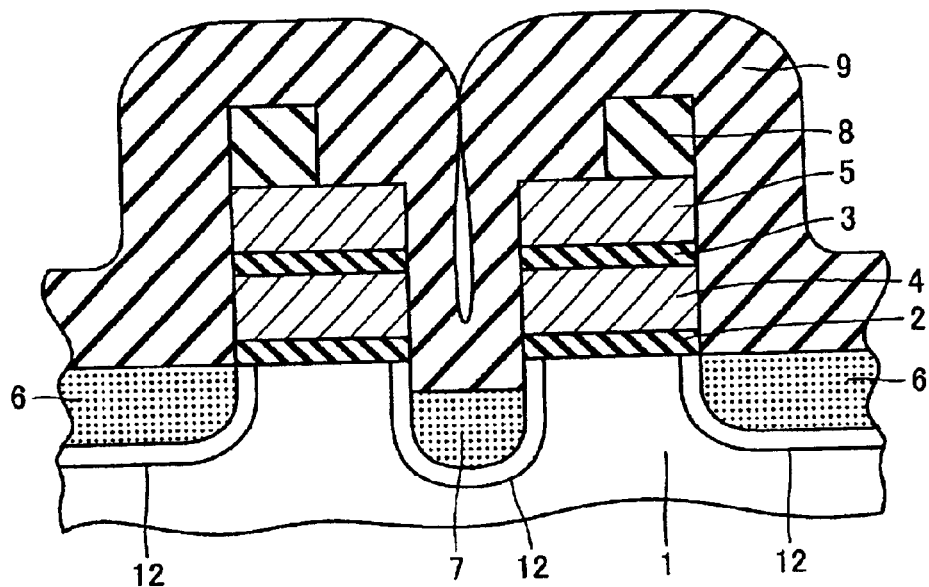
FIG. 3 is an explanatory view of the second step of the process for a semiconductor device according to Embodiment 1 of the present invention.
Figure 4:
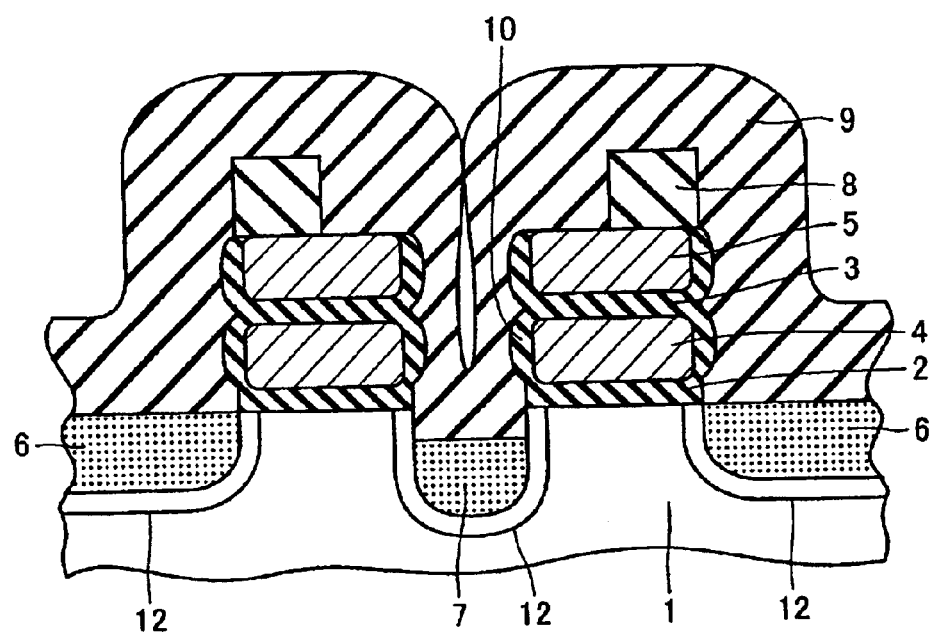
FIG. 4 is an explanatory view of the third step of the process for a semiconductor device according to Embodiment 1 of the present invention.
Figure 5:
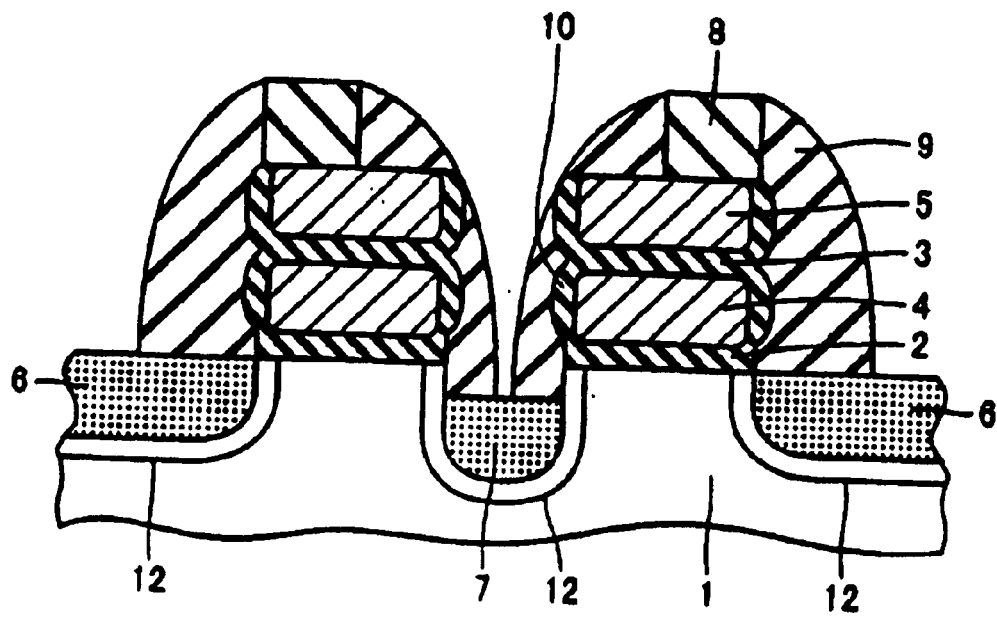
FIG. 5 is an explanatory view of the fourth step of the process for a semiconductor device according to Embodiment 1 of the present invention.

In the case that lamp annealing is carried out in the first gas mixture in the above described manner, as shown in FIG. 1, no nitride films 13 are formed on the sidewalls of floating gate electrodes 4. After this, as shown in FIG. 3, TEOS film 9 is formed by means of a CVD method, or the like, so as to cover the top surface of the substrate. Furthermore, by carrying out a heat treatment in the atmosphere of the second gas mixture, which includes oxygen, the sidewalls of floating gate electrodes 4 are thermally oxidized, as shown in FIG. 4, so that oxide films 10 are formed so as to cover the sidewalls of floating gate electrodes 4. Then, by etching TEOS film 9, the semiconductor device of the structure shown in FIG. 5 is gained.

Figure 9:
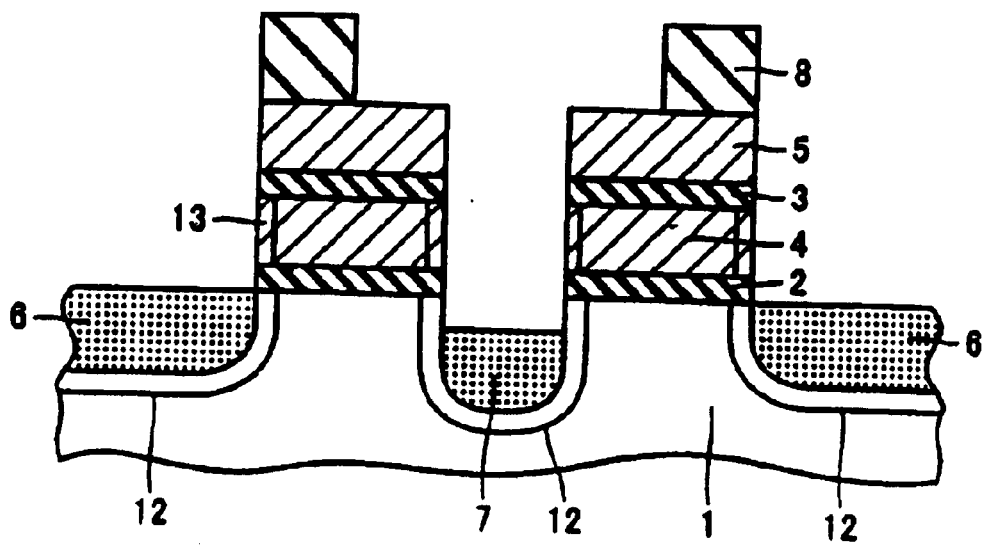
FIG. 9 is the first explanatory view of the case wherein lamp annealing is applied in a nitrogen flow in a process for a semiconductor device according to a prior art.
Figure 10:
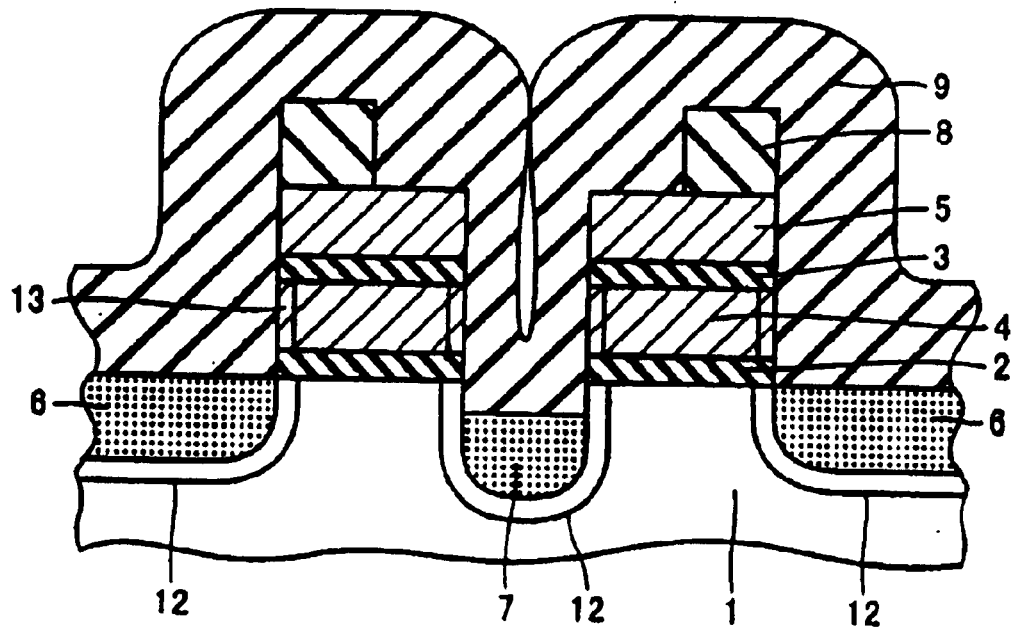
FIG. 10 is the second explanatory view of the case wherein lamp annealing is applied in a nitrogen flow in the process for a semiconductor device according to the prior art.

After the injection of arsenic into source layer 7, the lamp annealing is carried out in the flow of the first gas mixture which includes oxygen and nitrogen instead of carrying out the lamp annealing in the nitrogen flow and, therefore, oxide films (not shown) are thinly formed on the sidewalls of floating gate electrodes 4 so as to prevent the formation of nitride films 13. As a result, silicon substrate 1 can include nitrogen without the formation of nitride films 13, which have become the problem in FIGS. 9 and 10. In addition, since no nitride films 13 are formed on the sidewalls of floating gate electrodes 4, oxide films 10 can be formed in a normal manner on the sidewalls of floating gate electrodes 4 when a heat treatment is carried out in the condition of being wrapped in TEOS film 9 in the subsequent step.

As a result, a semiconductor device, wherein electrons from the floating gate electrodes can be prevented from becoming volatized and, in addition, the occurrence of crystal defects is prevented by means of nitride generated in the silicon substrate, can be manufactured.

Here, the lamp annealing in the first gas mixture is carried out at a temperature of 1000±several hundreds of ° C. for approximately several tens of seconds. For example, it is carried out at 1100° C. for 30 seconds in order to gain the effects.

It has been mentioned that the oxygen content in the first gas mixture is preferably no less than 10% and no more than 70% in volume ratio and the reason for this is that, in the case that oxygen is less than 10% in volume ratio, oxide films sufficiently thick to prevent nitride films formation cannot be gained. In the case that oxygen is more than 70% in volume ratio, the silicon substrate cannot sufficiently receive nitrogen because the amount of nitrogen is too little. Accordingly, it is preferable for the oxygen content to be no less than 10% and no more than 70% in volume ratio.

Embodiment 2

Referring to FIG. 5, a semiconductor device according to Embodiment 2 of the present invention is described. This semiconductor device has oxide films 10 formed on the sidewalls of floating gates 4 so as to cover the sidewalls to the degree wherein no electrons become volatized. Here, this semiconductor device has impurity injection regions which contain arsenic as the impurity injected from the active regions of silicon substrate 1 as the semiconductor substrate toward the inside of the substrate and these impurity injection regions always include nitrogen.

In such a structure, a semiconductor device can be gained wherein crystal defects are prevented while electrons from the floating gate electrodes can be prevented from becoming volatized. In addition, a semiconductor device of such a structure can be easily manufactured by applying the process described in Embodiment 1.

Here, in each of the above described embodiments, though arsenic is used as the impurity, boron or phosphorous may be used as the impurity instead of arsenic. However, the usage of arsenic is preferable because it can easily be made to enter into the silicon substrate through injection due to its large atomic mass.

According to the present invention, the active regions can receive nitrogen without the formation of nitrogen films on the sidewalls of the floating gate electrodes because of the lamp annealing step of carrying out a heat treatment in the atmosphere of the first gas mixture, which includes nitrogen and oxygen. Accordingly, in the oxide film formation step, oxide films can be formed in a normal manner on the sidewalls of the floating gate electrodes so that a semiconductor device wherein electrons are prevented from becoming volatized can be manufactured.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A process for manufacturing a semiconductor device, which includes the following steps applied to a semiconductor substrate wherein a floating gate electrode having sidewalls is formed above the semiconductor substrate with an oxide film intervened and wherein active regions from which the surface of said semiconductor substrate is exposed are arranged in places adjoining both sides of said floating gate electrode, as seen from above, and an impurity is injected into said active regions:

a lamp annealing step of carrying out a heat treatment in the atmosphere of a first gas mixture which includes nitrogen and oxygen; and a oxygen film formation step of carrying out a heat treatment in the atmosphere of a second gas mixture which includes oxygen so as to form an oxide film on said sidewalls after said lamp annealing step.

2. The process for manufacturing a semiconductor device according to claim 1, wherein a gas mixture, which includes no less than 10% and no more than 70% of oxygen in volume ratio, is used as said first gas mixture.

3. The process for manufacturing a semiconductor device according to claim 1, wherein said impurity is arsenic.

* * * * *